(12) United States Patent
Akikuni et al.

(10) Patent No.: US 6,445,198 B1
(45) Date of Patent: Sep. 3, 2002

(54) ELECTRO-OPTIC SAMPLING PROBE AND A METHOD FOR ADJUSTING THE SAME

(75) Inventors: Fumio Akikuni; Katsushi Ohta; Tadao Nagatsuma; Mitsuru Shinagawa; Junzo Yamada, all of Tokyo (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/541,584

(22) Filed: Apr. 3, 2000

(30) Foreign Application Priority Data

Apr. 6, 1999 (JP) .......................................... 11-099381

(51) Int. Cl.[7] .......................................... G01R 31/308
(52) U.S. Cl. ........................ 324/753; 324/750; 324/752
(58) Field of Search ............................... 324/73.1, 751, 324/753, 750, 752, 96; 359/246, 252, 315, 245, 240, 251

(56) References Cited

U.S. PATENT DOCUMENTS

| | | | |
|---|---|---|---|
| 4,891,580 A | | 1/1990 | Valdmanis |
| 5,034,683 A | * | 7/1991 | Takahashi et al. .......... 324/753 |
| 5,465,043 A | | 11/1995 | Sakai .......................... 324/96 |
| 5,479,106 A | | 12/1995 | Takahashi et al. .......... 324/753 |
| 5,666,062 A | * | 9/1997 | Takahashi et al. .......... 324/753 |
| 5,808,473 A | * | 9/1998 | Shinagawa et al. ......... 324/753 |
| 5,896,035 A | * | 4/1999 | Takahashi ................... 324/753 |

FOREIGN PATENT DOCUMENTS

GB     2344171 A     5/2000

OTHER PUBLICATIONS

German Search Report.

* cited by examiner

*Primary Examiner*—Ernest Karlsen
*Assistant Examiner*—Minh Tang
(74) *Attorney, Agent, or Firm*—Darby & Darby

(57) ABSTRACT

An electro-optic sampling probe includes an electro-optic element which is to be positioned to contact wiring on an IC wafer surface which is a measurement target and whose optical characteristics are changed depending on an electric field applied via the wiring and an electro-optic sampling optical system module having a polarized beam splitter, a wave plate, and a photo diode. The module separates light, which is transmitted through the electro-optic element and is reflected by a surface of the electro-optic element from laser light emitted from the outside and converts the separated light into an electric signal, and includes an optical axis adjuster attached to a detachable portion of an optical fiber that emits the laser light for adjusting the optical axis of the laser light and a light receiving surface adjuster attached to the detachable portion of the photo diode for adjusting the position of a light receiving surface of the photo diode.

5 Claims, 4 Drawing Sheets

ELECTRO-OPTIC SAMPLING PROBE AND A METHOD FOR ADJUSTING THE SAME

BACKGROUND OF THE INVENTION

1. Field of the Invention

The present invention relates to an electro-optic sampling probe which combines an electric field produced by a signal, which is a target of measurement, with an electro-optic crystal, emits laser light through this electro-optic crystal, and observes waveforms of the measurement target signal, based on the polarization state of the laser light, and in particular, to an electro-optic sampling probe which improves an optical system of the probe.

This application is based on Japanese Patent Application No. Hei 11-99381, the contents of which are incorporated herein by reference.

2. Description of the Related Art

By combining an electric field produced by a signal, which is a target of measurement, with an electro-optic crystal, and by emitting laser light through this electro-optic crystal, waveforms of the measurement target signal can be observed, based on the polarization state of the laser light. When the measurement target signal is sampled by pulses of the laser light, the time resolution can be remarkably increased. An electro-optic probe, which utilizes this phenomenon, is utilized by an electro-optic sampling probe.

As compared with a conventional probe using an electric probe, the electro-optic sampling probe (hereinafter, referred to as an "EOS probe") has the following advantages:

1) because a ground line is not required to measure the signal, the measurement is facilitated,
2) because the end of the electro-optic probe is insulated from a circuit system, a high input impedance can be obtained, and, as the result, the condition of the measurement target point is not disturbed.
3) the light pluses enables a wide range measurement on the order of GHz, and
4) by contacting the electro-optic crystal with a wafer such as an IC and collecting laser light on the wiring on the IC wafer, even thin wiring which a metal pin cannot contact physically can be measured.

These features have gained attention.

The EOS probe of the background technique will be explained with reference to FIG. 4.

In FIG. 4, reference numeral 1 denotes an IC wafer, which is connected through power source lines, and signal lines to the outside. Reference numeral 2 denotes an electro-optic element made of an electro-optic crystal. Reference numeral 3 denotes an objective lens for collecting light entering the electro-optic element 2. Reference numeral 4 denotes a probe having a dichroic mirror 4a, and a half mirror 4b. Reference numeral 6a denotes an EOS optical system module (hereinafter referred to as an "EOS optical system"), which comprises a photo diode, a polarized beam splitter, a wavelength plate, etc. Reference numeral 69 denotes a fiber collimator attached to one end of the EOS optical system.

Reference numeral 7 denotes a halogen lamp for illuminating the IC wafer 1 to be measured. Reference numeral 8 denotes an infrared camera (hereinafter referred to as an IR camera) for attaining a condensed light point on the wiring on the IC. Reference numeral 9 denotes an absorbing stage for absorbing and fixing the IC wafer 1, which is precisely movable in the directions of X-, Y-, and Z-axes which are perpendicular to each other. Reference numeral 10 denotes a level block (a part thereof is omitted) on which the absorbing stage 9 is mounted. Reference numeral 11 denotes an optical fiber for transmitting laser light from the outside, which is fixed to the fiber collimator 69 by means of the optical fiber end 11a. This optical fiber end 11a is detachable so that a different optical fiber 11 can be used.

Referring to FIG. 4, an optical path for the laser light from the outside will be explained. In FIG. 4, reference character A denotes the optical path of the laser light within the probe 4.

The laser light, which enters the EOS optical system 6a from the optical fiber 11, is converted into collimated light by the fiber collimator 69, proceeds through the EOS optical system 6a, and enters the probe 4. The light proceeds through the probe 4, and is deflected by the dichroic mirror 4a by 90 degrees, and condensed by the objective lens 3 onto the surface, which faces the IC wafer 1, of the electro-optic element 2 placed on the wiring on the IC wafer 1.

The wavelength of the laser light entering the EOS optical system 6a through the optical fiber 11 is 1550 nm. The dichroic mirror 4a has characteristics to allow 5% of light at the wavelength of 1550 nm to transmit and to reflect 95% of the light. That is, 95% of the light emitted from the laser light source is reflected and deflected by 90 degrees.

On the surface facing the IC wafer 1 of the electro-optic element 2, a dielectric mirror is disposed. The laser light reflected on the mirror is converted into collimated light by the objective lens 3, returns to the EOS optical system 6a through the same path, and enters the photo diode of the EOS optical system 6a. The construction of the EOS optical system 6a will be described later.

Next, the operation for positioning the IC wafer 1 with respect to the path of the light from the halogen lamp 9 using the halogen lamp 7 and the IR camera 8 will be explained. In FIG. 4, reference character B denotes the light path of the light from the halogen lamp 7.

The halogen lamp 7 emits light having wavelengths between 400 nm and 1650 nm.

The light emitted from the halogen lamp 7 is deflected by 90 degrees at the half mirror 4b, proceeds straight through the dichroic mirror 4a, and illuminates the IC wafer 1. The half mirror 4b equalizes the reflected light and the transmitted light.

The IR camera 8 receives an image of a part of the IC wafer 1 which is within the field of view of the objective lens 3 and is illuminated by the halogen lamp 7, and displays the infrared image on a monitor 8a. An operator precisely adjusts the absorbing stage 9 while watching the image displayed on the monitor 8a, so that the wiring which is the measurement target on the IC wafer 1 enters the field of view.

Further, the operator adjusts the absorbing stage 9 or the probe 4 while confirming from the image from the IR camera 8 that the laser light, which enters the EOS optical system 6a through the optical fiber 11, is reflected from the surface of the electro-optic element 2 placed on the wiring on the IC wafer 1, and passes through the dichroic mirror 4a, so that this laser light condenses at one point on the surface of the electro-optic element 2 on the wiring which is the measurement target. Because the dichroic mirror 4a has characteristics to allow 5% of the wavelengths of the laser light to be transmitted, this laser light can be confirmed by the IR camera 8.

Next, the operation for measuring the measurement target signal by the EOS probe shown in FIG. 4 will be explained.

When a voltage is applied on the wiring on the IC wafer 1, an electric field is applied to the electro-optic element 2, in which the refractive index then changes because of Pockels effect. Thus, while the laser light enters the electro-optic element 2, is reflected from the surface facing the IC wafer 1, returns through the same path, and goes out of the electro-optic element 2, the polarization of the light varies. The light whose polarization vanes enters the EOS optical system 6a again.

The EOS optical system 6a converts the change in polarization into a change in light intensity, which is then converted by the photo diode into an electric signal. This signal is processed by a signal processor (not shown). Thus, the electric signal applied to the wiring on the IC wafer 1 can be measured.

Next, the construction of the EOS optical system 6a shown in FIG. 4 will be explained.

FIG. 5 shows the construction of the EOS optical system 6a in detail. In FIG. 5, reference numerals 61 and 64 denote half wave plates, and reference numeral 62 denotes a quarter wave plate. Reference numerals 63 and 66 denote polarization beam splitters, and reference numeral 65 denotes a Faraday element. The half wave plates 61 and 64, the quarter wave plate 62, the polarization beam splitters 63 and 66, and the Faraday element 65 constitute an optical isolator 60. Reference numerals 67 and 68 denote photo diodes for receiving the laser light. A differential output signal of the two photo diodes 67 and 68 is the result of the measurement.

The half wave plate 61 and the quarter wave plate 62 adjust the balance of the light entering two diodes 67 and 68.

Next, the operation for measuring the electric signal flowing through the wiring on the IC wafer 1 by the EOS optical system 6a will be explained.

The EOS optical system 6a receives the laser light through the optical fiber 11 from the external light source. This laser light is converted into collimated light by the fiber collimator 69.

This collimated light is deflected by 90 degrees by the dichroic mirror 4a of the probe 4, and is condensed by the objective lens 3. The condensed laser light passes through the electro-optic element 2, and reaches the surface of the electro-optic element 2 facing the wiring on the IC wafer 1.

As a voltage is applied to the wiring, the electric field is applied to the electro-optic element 2. In the electro-optic element 2, the refractive index then changes because of Pockels effect. Thus, while the laser light enters and passes through the electro-optic element 2, the polarization of the light varies. The laser light whose polarization varies is reflected by the mirror of the surface of the electro-optic element 2 on the wiring on the IC wafer 1, goes through the same path in the reverse direction, and enters the EOS optical system 6a. The laser light is then separated by the optical isolator 60, enters the photo diodes 67 and 68, and is converted into the electric signal.

As the voltage at the measurement point (the wiring on the IC wafer 1) varies, a variation in the polarization caused by the electro-optic element 2 appears as the difference between the outputs from the photo diodes 67 and 68. By detecting this difference between the outputs, the electric signal transmitted through the wiring on the IC wafer 1 can be measured.

The conventional electro-optic sampling probe, however, has the long path of the collimated light from the fiber collimator 69 to photo diodes 67 and 68, as shown in FIG. 4, and requires a large number of the parts to constitute the optical system. Therefore, there is the problem that the optical axis may be shifted so that the measurement may be inaccurate.

Furthermore, in this background technique, the light is reflected by the surface, which faces the IC wafer 1, of the electro-optic element 2 placed on the wiring on the IC wafer 1, and is received by the photo diodes 67 and 68. Therefore, the problem arises that, when the IC wafer 1 which is the measurement target, or the electro-optic element 2 is exchanged, the relationship of the positions of the IC wafer 1 or the electro-optic element 2, and the optical system may be changed so that the optical axis may be shifted.

Further, there is the problem that, when the optical fiber end 11a is detached, the direction of the collimated light emitted from the fiber collimator 69 may be changed.

BRIEF SUMMARY OF THE INVENTION

It is therefore an object of the present invention to provide an electro-optic sampling probe which can easily correct the shift of the optical axis even when an IC wafer which is the measurement target or an electro-optic element is exchanged, or when an optical fiber is detached.

In order to accomplish the above object, in a first aspect of the present invention, the electro-optic sampling probe comprises: an electro-optic element which is positioned in contact with wiring on an IC wafer surface which is a measurement target, and whose optical characteristics are changed, depending on an electric field applied via the wiring; and an electro-optic sampling optical system module having a polarized beam splitter, a wave plate, and a photo diode, the module for separating light, which is transmitted through the electro-optic element and is reflected by a surface of the electro-optic element, from laser light emitted from the outside, and for converting the separated light into an electric signal. The electro-optic sampling optical system module comprises: an optical axis adjuster, attached to a detachable portion of an optical fiber for emitting the laser light, for adjusting the optical axis of the laser light; and a light receiving surface adjuster, attached to the a detachable portion of the photo diode, for adjusting the position of the light receiving surface of the photo diode.

In a second aspect of the invention, the optical axis adjuster comprises: a precisely movable stage with three axes which are perpendicular to each other; and a rotatable stage with two axes.

In a third aspect of the invention, the light receiving surface adjuster comprises a precisely movable stage with two axes which are perpendicular to each other.

In a fourth aspect of the invention, the method for adjusting an optical axis of an electro-optic sampling probe having an electro-optic element which is positioned in contact with wiring on an IC wafer surface as a measurement target, and whose optical characteristics are changed, depending on an electric field applied via the wiring, and an electro-optic sampling optical system module having a polarized beam splitter, a wave plate, and a photo diode, the module for separating light, which is transmitted through the electro-optic element and is reflected by a surface of the electro-optic element, from laser light emitted from the outside, and for converting the separated light into an electric signal, the method comprising the steps of: adjusting the emission point of the laser light within a plane by moving the optical fiber for emitting the laser light in the directions of two axes which are perpendicular to each other; adjusting the state of the collimated light from the electro-optic sampling optical system module by moving the optical fiber in the direction of the optical axis of the optical fiber; adjusting the inclination of the plane by rotating the two axes, which are perpendicular to each other, around their axes, respectively; and adjusting a light receiving surface of the diode by moving the diode in the directions of two axes which are perpendicular to each other.

In a fifth aspect of the invention, the adjustments in the fourth aspect are conducted so that an output signal from the photo diode is maximized.

According to the invention, because the electro-optic sampling optical system module comprises an optical axis adjuster, attached to a detachable portion of an optical fiber for emitting the laser light, for adjusting the optical axis of the laser light, and an light receiving surface adjuster, attached to the a detachable portion of the photo diode, for adjusting the position of a light receiving surface of the photo diode, a shift of the optical axis caused by detaching the optical fiber can be easily corrected by the above process.

Further, the adjusters can be successively adjusted while an operator confirms the output signal from the photo diode, and therefore the optical axis of the optical fiber can be appropriately positioned.

DETAILED DESCRIPTION OF THE INVENTION

The embodiment of the electro-optic sampling probe according to the present invention will be explained with reference to figures.

Figure 1:
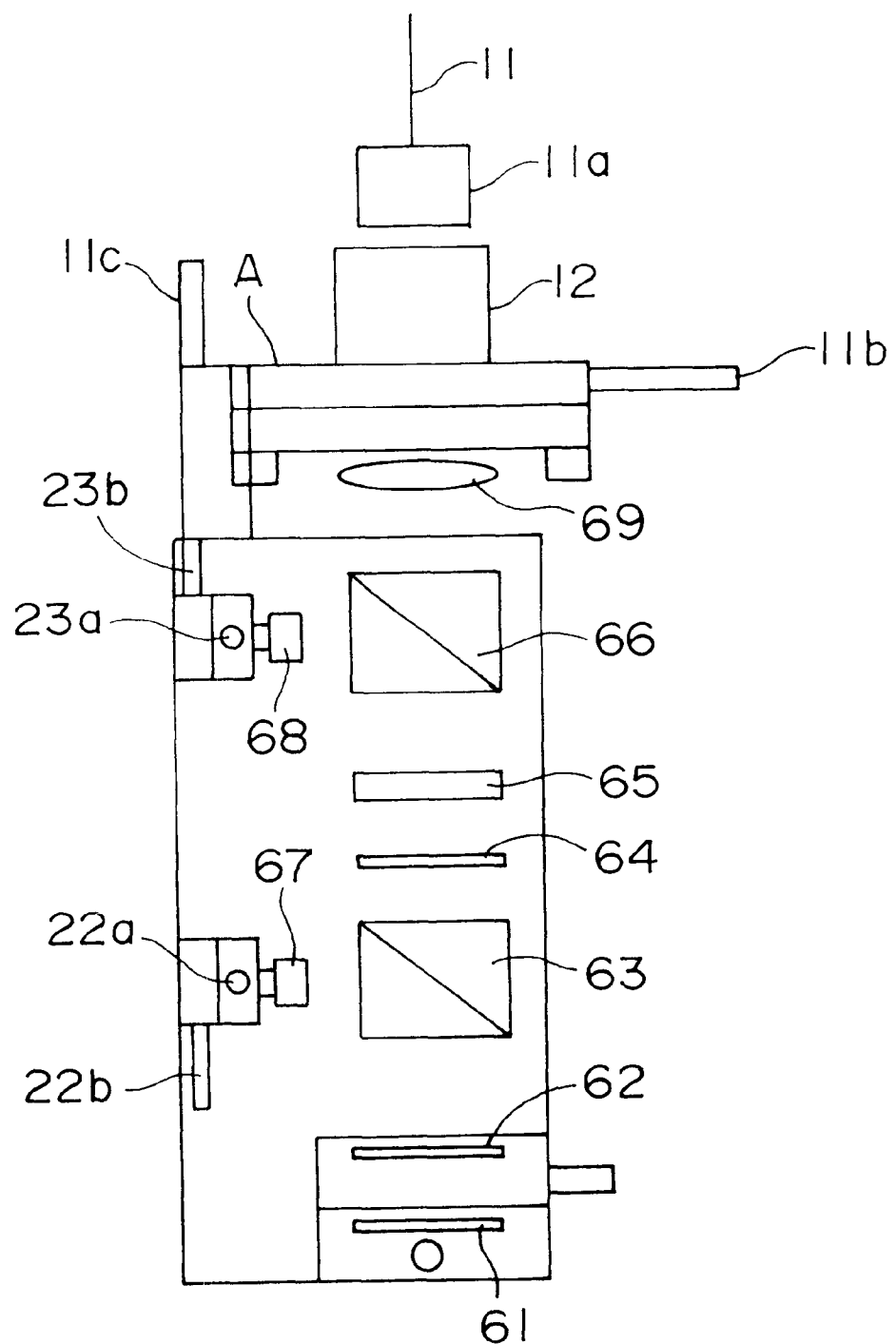
FIG. 1 is a front view of the electro-optic sampling optical system module of the present invention.
Figure 2:
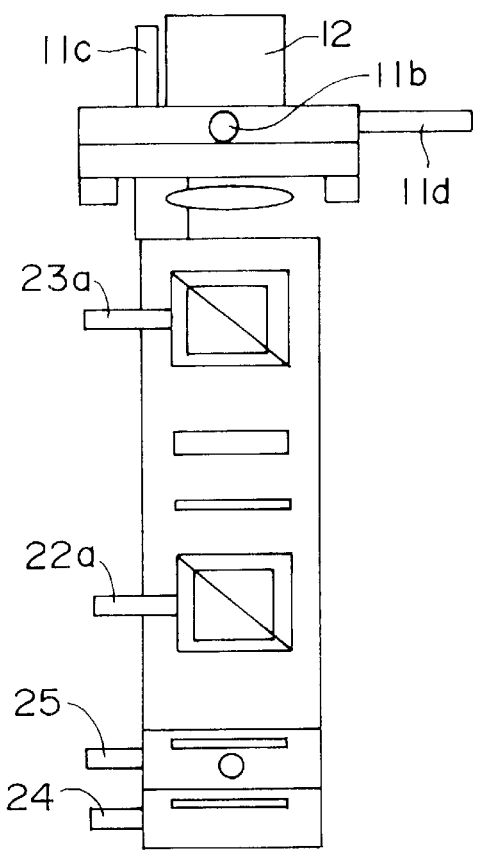
FIG. 2 is a side view of the electro-optic sampling optical system module of the present invention.
Figure 3:
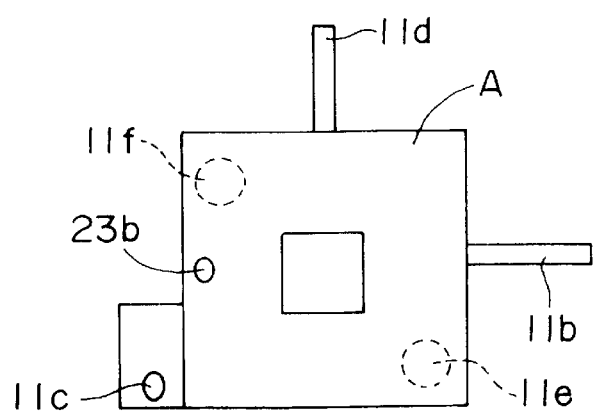
FIG. 3 is a top view of the electro-optic sampling optical system module of the present invention.
Figure 4:
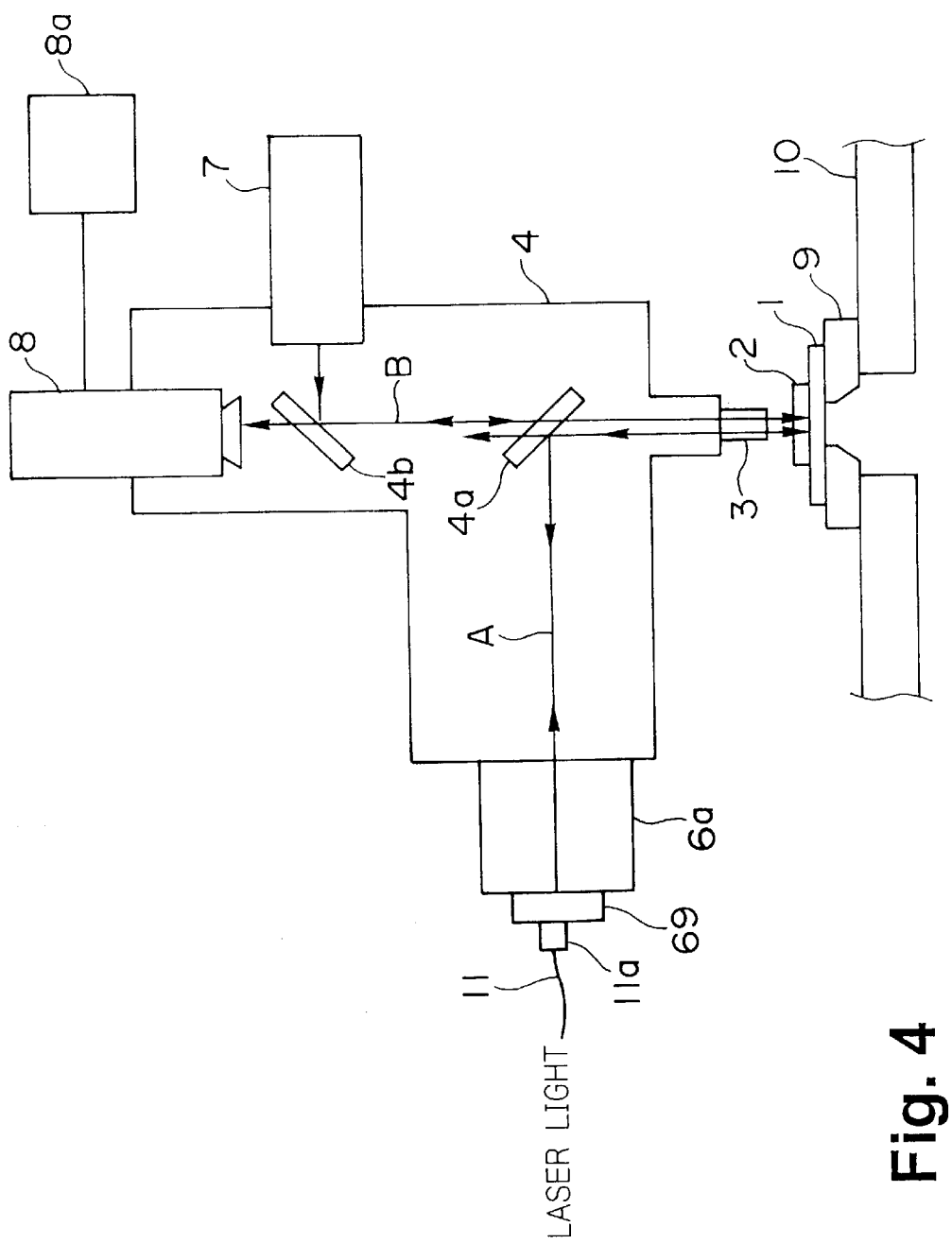
FIG. 4 is a diagram showing a conventional electro-optic sampling probe.
Figure 5:
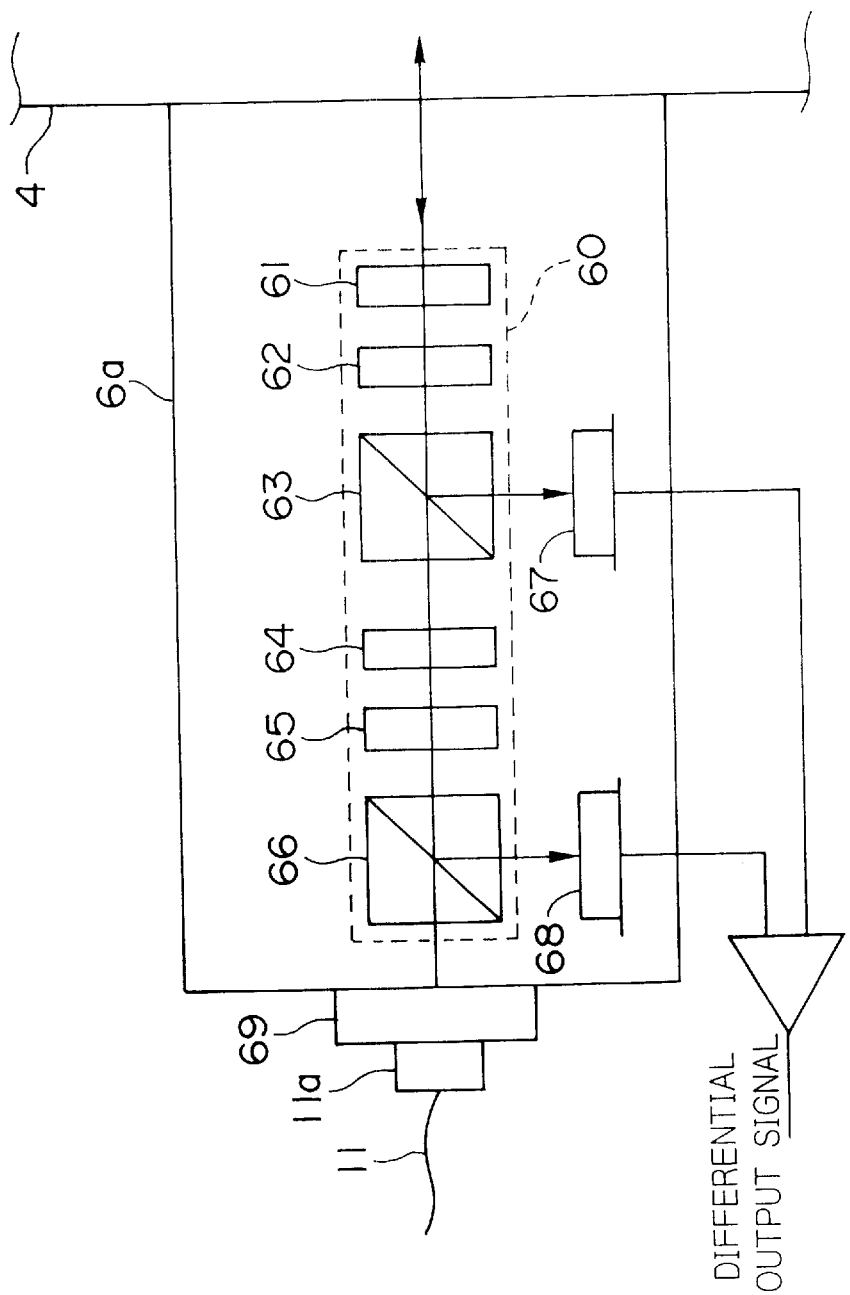
FIG. 5 is a diagram showing a conventional electro-optic sampling optical system module.

FIG. 1 is a front view showing an EOS system 6a of the embodiment, FIG. 2 is a side view showing the EOS system 6a, and FIG. 3 is a top view showing the EOS system 6a. In FIG. 1, the parts identical to those in the background technique shown in FIG. 5 are denoted by the same reference numerals, and therefore their detailed description is omitted.

The difference between the present invention and the background technique is an adjuster of optical parts constituting the EOS optical system 6a.

In FIG. 1, reference numeral 12 denotes an optical fiber detachable portion for connecting or detaching an optical fiber end 11a. The optical fiber detachable portion 12 is fixed to a surface indicated by reference character A in FIG. 1. The surface A is perpendicular to the optical axis of light emitted from the optical fiber end 11a when the optical fiber end 11a is attached to the optical fiber detachable portion 12. The optical fiber detachable portion 12 is fixed to a precisely movable stage with three axes which are perpendicular to each other. Reference numeral 11b denotes a rotary control for precisely moving the optical fiber detachable portion 12 in the horizontal direction in FIG. 1. Reference numeral 11c denotes a rotary control for precisely moving the optical fiber detachable portion 12 in the vertical direction (top-to-bottom direction) in FIG. 1. By rotating the rotary control 11c, the optical fiber detachable portion 12 is precisely moved in the direction of the light emitted from the optical fiber end 11a so that the distance to the collimator 69 is changed. Thus, the collimation of the light can be adjusted.

In FIG. 2, reference numeral 1d denotes a rotary control for precisely moving the optical fiber detachable portion 12 in the horizontal direction (the right-to-left direction) in FIG. 2.

By rotating the rotary controls 11b and 11d, the position of the optical fiber detachable portion 12 can be adjusted in the plane parallel to the surface A. Further, by rotating the rotary control 11c, the position of the portion 12 can be adjusted in the direction of the optical axis.

Reference numerals 11e and 11f in FIG. 3 denote rotary controls for adjusting a rotatable stage (gate stage) for moving the optical axis from the optical fiber end 11a in the vertical direction in FIG. 3 (the top-to-bottom direction) and in horizontal the direction in FIG. 3 (the right-to-left direction).

Reference numerals 22a and 23a in FIGS. 1 and 2 denote rotary controls for precisely moving photo diodes 67 and 68 in the vertical direction with respect to the plane in FIG. 1 (the horizontal direction in FIG. 2).

Reference numerals 22b and 23b in FIGS. 1 and 3 denote rotary controls for precisely moving photo diodes 67 and 68 in the vertical direction in FIG. 1 (top-to-bottom direction).

Rotary controls 24 and 25 shown in FIG. 2 rotate a half-wave plate 61, and a quarter-wave plate 62 around the optical axis so as to control the quantity of light transmitted through the half-wave plate 61 and the quarter-wave plate 62.

The process for adjusting the EOS optical system 6a will be explained with reference to FIGS. 1 to 3.

The optical fiber end 11a is attached to the optical fiber detachable portion 12.

Then, by rotating the rotary control 11b, the precisely movable stage is moved to adjust the position of the optical fiber detachable portion 12 in the horizontal direction in FIG. 1.

Then, by rotating the rotary control 11d, the precisely movable stage is moved to adjust the position of the optical fiber detachable portion 12 in the horizontal direction in FIG. 2.

By these adjustments, the optical fiber detachable portion 12 can be moved in the horizontal plane.

Then, by rotating the rotary control 11c, the precisely movable stage is moved so as to adjust the vertical position of the optical fiber detachable portion 12 in FIG. 1.

By this adjustment, the distance to the fiber collimator 69 is changed, and the collimation of the light can be adjusted.

Then, by rotating the rotary controls 11e and 11f, the rotatable stage is rotated so as to adjust the inclination of the optical axis of the light.

By this adjustment, the light emitted from the optical fiber end 11a reliably enters the electro-optic element 2. Further, when conducting this adjustment, the position of the optical fiber detachable portion 12 is adjusted so that the currents output from the photo diodes 67 and 68 are maximized.

Then, by rotating the rotary controls 22a, 23a, 22b, and 23b, the light receiving surfaces of the photo diodes 67 and 68 are precisely moved so that the currents output from the photo diodes 67 and 68 are maximized.

By this adjustment, even when the IC wafer 1 is slightly inclined, the light reflected by a mirror of the electro-optic element 2 reliably enters the photo diodes 67 and 68.

By rotating the rotary controls 24 and 25, the half-wave plate 61, and the quarter-wave plate 62 are rotated around the optical axis so that the currents output from the photo diodes 67 and 68 are equalized.

Thus, the shift of the optical axis caused by detaching the optical fiber can be easily corrected by the above process.

This invention may be embodied in other forms or carried out in other ways without departing from the spirit thereof.

The present embodiments are therefore to be considered in all respects illustrative and not limiting, the scope of the invention being indicated by the appended claims, and all modifications falling within the meaning and range of equivalency are intended to be embraced therein.

What is claimed is:

1. An electro-optic sampling probe comprising:

an electro-optic element to be positioned in contact with wiring on an IC wafer surface as a measurement target and whose optical characteristics are changed, depending on an electric field applied via said wiring; and an electro-optic sampling optical system module having a polarized beam splitter, a wave plate, and a photo diode having a light receiving surface, said module for separating light which is transmitted through said electro-optic element and is reflected by a surface of said electro-optic element from laser light emitted from the outside and for converting the separated light into an electric signal, wherein said electro-optic sampling optical system module comprises:

an optical axis adjuster attached to a detachable portion of an optical fiber for emitting said laser light for adjusting the optical axis of said laser light; and a light receiving surface adjuster on which said photo diode is mounted for adjusting the position of said light receiving surface of said photo diode in the directions of two axes which are perpendicular to each other and one of which is along a direction parallel to the axis of the laser light in order to enter the light reflected by said electro-optic element to the receiving surface of said photo diode.

2. An electro-optic sampling probe according to claim 1, wherein said optical axis adjuster comprises:

a movable stage with three axes which are perpendicular to each other; and a rotatable stage with two axes.

3. An electro-optic sampling probe according to claim 1, wherein said light receiving surface adjuster comprises a movable stage with two axes which are perpendicular to each other.

4. A method for adjusting an optical axis of an electro-optic sampling probe having an electro-optic element which is to be positioned to contact with wiring on an IC wafer surface as a measurement target and whose optical characteristics are changed depending on an electric field applied via said wiring, and an electro-optic sampling optical system module having a polarized beam splitter, a wave plate, and a photo diode having a light receiving surface, said module for separating light which is transmitted through said electro-optic element and is reflected by a surface of said electro-optic element from laser light emitted from the outside and for converting the separated light into an electric signal, said method comprising the steps of:

adjusting the emission point of said laser light within a plane by moving an optical fiber for emitting said laser light in the directions of two axes which are perpendicular to each other;

adjusting the state of the collimated light from said electro-optic sampling optical system module by moving said optical fiber in the direction of the optical axis of said optical fiber;

adjusting the inclination of said plane by rotating said two axes, which are perpendicular to each other, around their axes, respectively; and adjusting said light receiving surface of said photo diode by moving said photo diode in the directions of two axes which are perpendicular to each other and any one of which is along a direction parallel to the axis of the laser light in order to enter the light reflected by said electro-optic element to the receiving surface of said photo diode.

5. A method according to claim 4, wherein the adjustments are conducted so that an output signal from said photo diode is maximized.

* * * * *